US007297462B2

(12) United States Patent
Van Aert et al.

(10) Patent No.: US 7,297,462 B2
(45) Date of Patent: Nov. 20, 2007

(54) HEAT-SENSITIVE LITHOGRAPHIC PRINTING PLATE PRECURSOR

(75) Inventors: Huub Van Aert, Pulderbos (BE); Bert Groenendaal, Sinaai (BE); Hieronymus Andriessen, Beerse (BE); Martin Moeller, Aachen (DE); Uwe Beginn, Eynatten/Raeren (BE); Ahmed Mourran, Aachen (DE)

(73) Assignee: AGFA Graphics NV, Mortsel (BE)

(*) Notice: Subject to any disclaimer, the term of this patent is extended or adjusted under 35 U.S.C. 154(b) by 161 days.

(21) Appl. No.: 10/987,928

(22) Filed: Nov. 12, 2004

(65) Prior Publication Data

US 2005/0106501 A1 May 19, 2005

Related U.S. Application Data

(60) Provisional application No. 60/526,321, filed on Dec. 2, 2003.

(30) Foreign Application Priority Data

Nov. 17, 2003 (EP) .................................. 03104238

(51) Int. Cl.
*G03F 7/00* (2006.01)
*G03F 7/004* (2006.01)

(52) U.S. Cl. ................... 430/270.1; 430/302; 430/309; 430/401; 430/434; 430/494; 430/944; 430/945

(58) Field of Classification Search ............. 430/270.1, 430/302, 401, 434, 494, 944, 945; 40/309
See application file for complete search history.

(56) References Cited

U.S. PATENT DOCUMENTS

| | | | | |
|---|---|---|---|---|
| 4,081,572 | A | | 3/1978 | Pacansky |
| 5,569,573 | A | | 10/1996 | Takahashi et al. |
| 5,836,248 | A | | 11/1998 | Jarrold et al. |
| 5,836,249 | A | | 11/1998 | Chatterjee et al. |
| 5,839,369 | A | | 11/1998 | Chatterjee et al. |
| 5,839,370 | A | | 11/1998 | Chatterjee et al. |
| 5,855,173 | A | | 1/1999 | Chatterjee et al. |
| 5,870,956 | A | | 2/1999 | Ghosh et al. |
| 5,893,328 | A | | 4/1999 | Ghosh et al. |
| 6,153,352 | A | * | 11/2000 | Oohashi et al. .......... 430/270.1 |
| 6,165,691 | A | * | 12/2000 | Damme et al. ............. 430/303 |
| 6,362,274 | B1 | | 3/2002 | Legrand et al. |
| 6,423,469 | B1 | * | 7/2002 | DoMinh et al. ......... 430/270.1 |
| 6,455,230 | B1 | * | 9/2002 | Damme et al. ............. 430/302 |
| 6,534,237 | B1 | * | 3/2003 | Kawamura et al. ...... 430/270.1 |
| 6,582,882 | B2 | | 6/2003 | Pappas et al. |
| 2002/0172888 | A1 | | 11/2002 | Huang et al. |
| 2003/0008223 | A1 | * | 1/2003 | Kawamura et al. ............ 430/7 |

FOREIGN PATENT DOCUMENTS

| | | | |
|---|---|---|---|
| EP | 0 200 488 | A2 | 12/1986 |
| EP | 0 646 476 | A1 | 4/1995 |
| EP | 0 652 483 | A1 | 5/1995 |
| EP | 0 949 088 | A1 | 10/1999 |
| WO | WO 94/02395 | A1 | 2/1994 |
| WO | WO 98/29258 | A1 | 7/1998 |
| WO | WO 02/082183 | A1 | 10/2002 |

OTHER PUBLICATIONS

Search Report for EP 03 10 4238 (Apr. 20, 2004).

* cited by examiner

*Primary Examiner*—Amanda Walke
(74) *Attorney, Agent, or Firm*—Leydig, Voit & Mayer, Ltd

(57) ABSTRACT

A heat sensitive lithographic printing plate precursor is disclosed comprising on a support having a hydrophilic surface or which is provided with a hydrophilic layer, a coating comprising an infrared light absorbing agent and a copolymer which comprises a plurality of recurring units X having a hydrophilic polymeric pendant group and a plurality of recurring units Y having a hydrophobic polymeric pendant group. Said coating is capable of switching from a hydrophilic state into a hydrophobic state after exposure to heat and/or infrared light.

27 Claims, No Drawings

HEAT-SENSITIVE LITHOGRAPHIC PRINTING PLATE PRECURSOR

This application claims the benefit of U.S. Provisional Application No. 60/526,321 filed Dec. 02, 2003 and EP Patent Application No. 03104238.5 filed on Nov. 17, 2003 which are incorporated by reference in their entirety.

FIELD OF THE INVENTION

The present invention relates to a heat-sensitive lithographic printing plate precursor.

BACKGROUND OF THE INVENTION

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical photosensitive printing plate precursor for computer-to-film methods comprises a hydrophilic support and an image-recording layer which includes UV-sensitive compositions. Upon image-wise exposure of a negative-working plate, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called 'negative-working'. Also positive-working materials, wherein the exposed areas define the non-printing areas, are known, e.g. plates having a novolac/naphtoquinone-diazide coating which dissolves in the developer only at exposed areas.

In addition to the above- photosensitive materials, also heat-sensitive printing plate precursors have become very popular. Such thermal materials offer the advantage of daylight-stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by cross-linking of a polymer or by particle coagulation of a thermoplastic polymer latex, and solubilization by the destruction of intermolecular interactions.

Thermal plates which require no processing are also known; such plates are typically of the so-called ablative type, i.e. the differentiation between hydrophilic and oleophilic areas is produced by heat-induced ablation of one or more layers of the coating, so that at exposed areas a surface is revealed which has a different affinity towards ink or fountain than the surface of the unexposed coating. A major problem associated with ablative plates, however, is the generation of ablation debris which may contaminate the electronics and optics of the exposure device and which needs to be removed from the plate by wiping it with a cleaning solvent, so that ablative plates are often not truly processless. Ablation debris which is deposited onto the plate's surface may also interfere during the printing process.

Other thermal plates that require no processing are described in U.S. Pat. No. 5,855,173, U.S. Pat. Nos. 5,839,369 and 5,839,370 where a method relying on the image-wise hydrophilic-hydrophobic transition of a ceramic such as a zirconia ceramic and the subsequent reverse transition in an image erasure step. This image-wise transition is obtained by exposure to infrared laser irradiation at a wavelength of 1064 nm at high power (the average power is 1 W to 50 W and the peak power lies between 6 kW and 100 kW) which induces local ablation and formation of substoichiometric zirconia. U.S. Pat. No. 5,893,328, U.S. Pat. No. 5,836,248 and U.S. Pat. No. 5,836,249 disclose a printing material comprising a composite of zirconia alloy and α-alumina which can be imaged using similar exposure means to cause localized "melting" of the alloy in the exposed areas and thereby creating hydrophobic/oleophilic surfaces. A similar printing material containing an alloy of zirconium oxide and Yttrium oxide is described in U.S. Pat. No. 5,870,956. The high laser power output required in these prior art methods implies the use of expensive exposure devices.

Another type of processless plates are printing plates based on a so-called "switching" reaction where a hydrophilic surface is irreversibly changed into an oleophilic surface or vice versa by imagewise exposure. EP 652 483 for example, describes a positive working printing plate based on an acid catalyzed cleavage of acid-labile groups pendant from a polymer backbone. EP 200 488 and U.S. Pat. No. 4,081,572 describe negative working plates where a hydrophilic/hydrophobic conversion is obtained by a chemical reaction upon imagewise exposure to heat. Other examples of processless plates are based on the thermally induced rupture of microcapsules and the subsequent reaction of the microencapsulated oleophilic materials (isocyanates) with functional (hydroxyl-)groups on cross-linked hydrophilic binders (U.S. Pat. No. 5,569,573; EP 646 476; WO94/2395; WO98/29258).

U.S. Pat. No. 6,582,882 describes an imaging element comprising a graft copolymer having a hydrophobic backbone and a plurality of pendant hydrophilic groups or a plurality of pendant groups comprising hydrophilic and hydrophobic segments. Upon exposure of the imaging element to thermal energy, the exposed areas become less soluble in a developer than the unexposed areas.

U.S. Pat. No. 6,362,274 describes grafted copolymers comprising three sequences: one sequence for anchoring on solid particles such as pigments and fillers, one hydrophobic sequence and one hydrophilic sequence for using the copolymers in aqueous and/or organic medium. The disclosed copolymers are of particular interest in a wide range of paint formulations; there is no reference in the cited prior art document to lithographic printing plates.

None of the prior art discloses the heat-sensitive copolymer of the present invention in lithographic printing plates.

SUMMARY OF THE INVENTION

It is an aspect of the present invention to provide a heat sensitive lithographic printing plate precursor comprising on a support having a hydrophilic surface or which is provided with a hydrophilic layer, a coating comprising an infrared light absorbing agent and a copolymer, wherein said copolymer comprises a plurality of recurring units X having a hydrophilic polymeric pendant group and a plurality of recurring units Y having a hydrophobic polymeric pendant group.

It is another aspect of the present invention to provide a method for preparing a heat-sensitive lithographic printing plate without wet processing comprising the steps of (i) applying on a support having a hydrophilic surface or which is provided with a hydrophilic layer, a coating comprising an infrared light absorbing agent and a copolymer comprising a plurality of recurring units X having a hydrophilic polymeric pendant group and a plurality of recurring units Y having a hydrophobic polymeric pendant group (ii) image-wise exposing the coating to heat and/or infrared light.

It is another aspect of the present invention to provide a printing plate precursor whereof the coating is capable of switching from a hydrophilic state into a hydrophobic state or vice versa after exposure to heat and/or infrared light.

Specific embodiments of the invention are defined in the dependent claims.

DETAILED DESCRIPTION OF THE INVENTION

According to the present invention, there is provided a heat sensitive lithographic printing plate precursor comprising on a support having a hydrophilic surface or which is provided with a hydrophilic layer, a coating comprising an infrared absorbing agent and a copolymer comprising a plurality recurring units X having a hydrophilic polymeric pendant group and a plurality of recurring units Y having a hydrophobic polymeric pendant group, said copolymer hereinafter also referred to as "double comb graftcopolymer" or "DC-graftcopolymer".

The recurring unit X having a hydrophilic polymeric pendant group and the recurring unit Y having a hydrophobic polymeric pendant group may be represented by the following formula's:

X

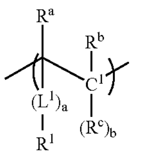

Y

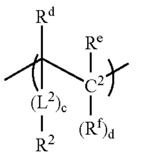

wherein a and c are 0 or 1, wherein $L^1$ and $L^2$ independently represent a linking group, wherein $R^a$, $R^b$, $R^c$, $R^d$, $R^e$ and $R^f$ independently represent hydrogen, an alkyl such as methyl, ethyl, propyl, isopropyl, . . . , a cycloalkyl such as cyclopentane, cyclohexane, 1,3-dimethylcyclohexane, . . . , an aryl, a heteroaryl, a carboxylic acid, an ester of a carboxylic acid, an amide of a carboxylic acid, or an alkyl or aryl group which is substituted with a carboxylic acid, with an ester of a carboxylic acid or with an amide of a carboxylic acid, wherein b is 0 or 1 and when b=0, $L^1$ is further bound to $C^1$ to form a cyclic structure, wherein d is 0 or 1 and when d=0, $L^2$ is further bound to $C^2$ to form a cyclic structure, and wherein $R^1$ and $R^2$ represent respectively a hydrophilic polymeric pendant group and a hydrophobic polymeric pendant group.

In a preferred embodiment the recurring units X and Y can be represented by the following formula's:

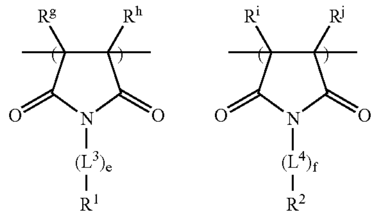

wherein e and f are 0 or 1, wherein $L^3$ and $L^4$ independently represent a linking group, wherein $R^g$, $R^h$, $R^i$ and $R^j$ independently represent hydrogen, an alkyl such as methyl, ethyl, propyl, isopropyl, . . . , cycloalkyl such as cyclopentane, cyclohexane, 1,3-dimethylcyclohexane, . . . , aryl, or heteroaryl group, and wherein $R^1$ and $R^2$ represent respectively a hydrophilic polymeric pendant group and a hydrophobic polymeric pendant group.

The linking groups $L^1$, $L^2$, $L^3$ and $L^4$ independently represent a linking group selected form the group comprising alkylene, arylene, heteroarylene, —O—, —CO—, —CO—O—, —O—CO—, —CS—, $—O—(CH_2)_k—$, $—(CH_2)_k—O—$, $—(CH_2)_k—O—CO—$, $—O—CO—(CH_2)_k—$, $—(CH_2)_k—O—CO—(CH_2)_l—$, $—CO—(CH_2)_k—COO——CO—O—(CH_2)_k—$, $—(CH_2)_k—COO—(CH_2)_l—$, $—(CH_2)_k—NH—$, $—NH—(CH_2)_k—$, $—(CH_2)_k—CONH—$, $—(CH_2)\ _kCONH—SO_2—$, $—NH—(CH_2)_k—O—(CH_2)_l$-, $—CO—(CH_2)_k$, $—(CH_2)_k—CO—$, —CO—NH—, —NH—CO—, —NH—CO—O—, —O—CO—NH, $—(CH_2)_k—CO—NH——NH—CO—(CH_2)_k—$, —NH—CO—NH—, —NH—CS—NH—, or combinations thereof;

wherein k and l independently represent an integer≧1, preferably an integer between 1 and 8.

When b=0 or when d=0, the linking groups $L^1$ and $L^2$ are further bound to respectively $C^1$ and $C^2$ and are trivalent groups. In this embodiment, $L^1$ and $L^2$ include a nitrogen atom and form a cyclic structure; they are independently represented by a linking group selected from the group comprising:

—CO—N<$_{CO}$—, —$(CH_2)_k$—N<, >N—$(CH_2)_k$—, —$(CH_2)_k$—CON<—, —$(CH_2)_k$—CON<$_{SO2}$—>N—$(CH_2)_k$—O—$(CH_2)_l$ —, —CO—N<, >N—CO—, >N—CO—O—, —O—CO—N<, —$(CH_2)_k$—CO—N<, >N—CO—$(CH_2)_k$—, >N—CO—NH—, >N—CS—NH—, or combinations thereof;

wherein k and l independently represent an integer≧1, preferably an integer between 1 and 8.

The hydrophilic polymeric pendant group comprises hydrophilic monomeric units which are polymerisable by an addition polymerisation or by a condensation polymerisation. The hydrophilic monomeric units are monomers which comprise an anionic, cationic or non-ionic group.

Examples of suitable hydrophilic monomers are selected from the group of alkylene oxides such as ethylene oxide, glycidol and propylene oxide, vinyl alcohol, acrylic acid, methacrylic acid, maleic acid, itaconic acid, crotonic acid, fumaric acid, hydroxyalkyl methacrylate such as hydroxyethyl methacrylate, hydroxyalkyl acrylate such as hydroxyethyl acrylate, vinylpyrolidone, acrylamides such as hydroxyethyl acrylamide, methacrylamides such as hydroxypropyl methacrylamide, vinyl methyl ether, vinyl sulfonate, vinylphosphonic acid, styrene sulfonic acid, sulphoethyl methacrylate, 2-acrylamido-2-methyl-1-propanesulfonic acid, or protonated or alkylated derivates of vinylpyridine, vinylimidazole or N-vinyl diethylamine.

The hydrophilic polymeric pendant group may also be selected from a polysaccharide, starch, a cellulose, a dextran, or derivate of cellulose or dextran.

The hydrophobic polymeric pendant group comprise hydrophobic monomeric units which are polymerisable by an addition polymerisation or by a condensation polymerisation.

Typical examples of recurring monomeric units having a hydrophilic polymeric pendant group are:

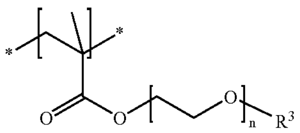

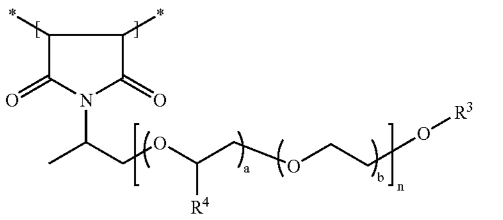

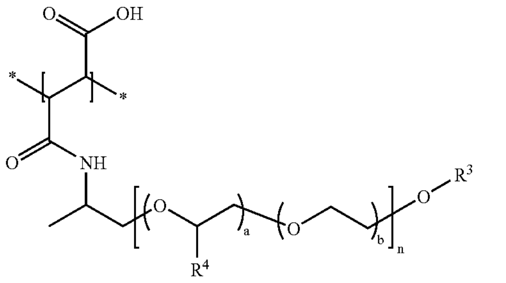

-continued

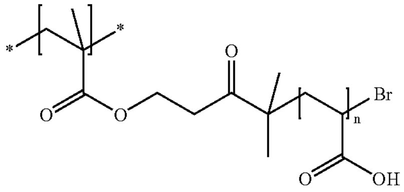

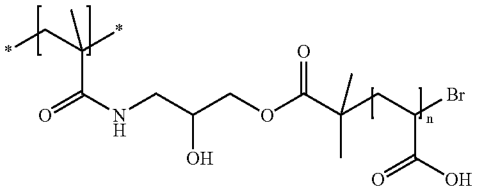

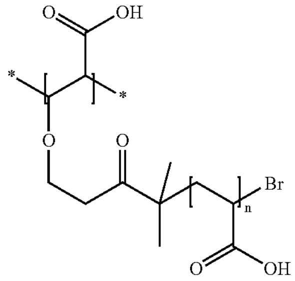

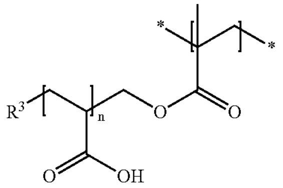

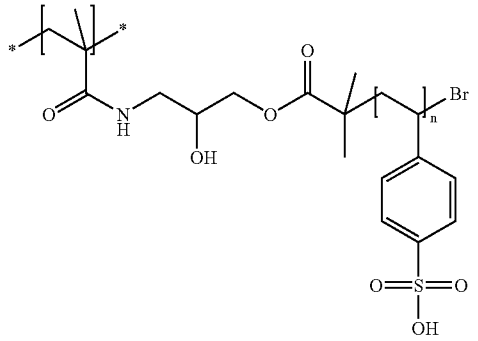

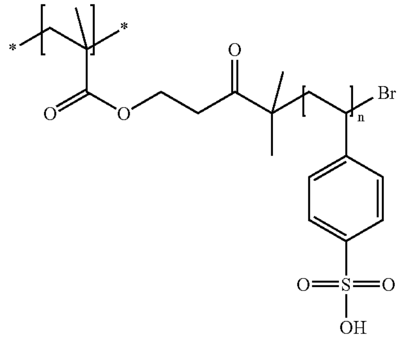

wherein each $R^3$ and $R^4$ independently are represented by a hydrogen or an alkyl group such as methyl, n-butyl and sec-butyl, and each n by an integer>3, and a and b by an integer>1.

Examples of hydrophobic monomeric units are selected from the group comprising siloxanes such as dimethylsiloxane, diphenylsiloxane and methylphenyl siloxane, perfluoroalkylethylene, alkylacrylates such as butylacrylate, 2-ethylhexylacrylate and cyclohexyl acrylate, alkyl methacrylates such as methyl methacrylate, butyl methacrylate, benzyl methacrylate, lauryl methacrylate and stearyl methacrylate, allyl methacrylate, fluorinated alkylacrylates such as trifluoroethylacrylate and pentafluoropropylacrylate, fluorinated alkylmethacrylates, ethylene, isoprene, butadiene, chlorinated or brominated monomers such as vinyl chloride or vinylidene chloride, vinyl esters such as vinyl propionate and vinyl stearate, vinyl ethers such as vinyl propylether, styrene, styrene derivatives, acrylonitrile, methacrylonitrile, N-alkylacrylamides and N-alkylmethacrylamides.

Typical examples of recurring monomeric units having a hydrophobic polymeric pendant group are:

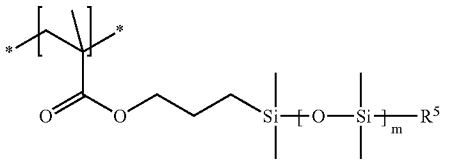

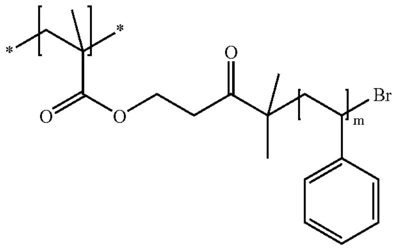

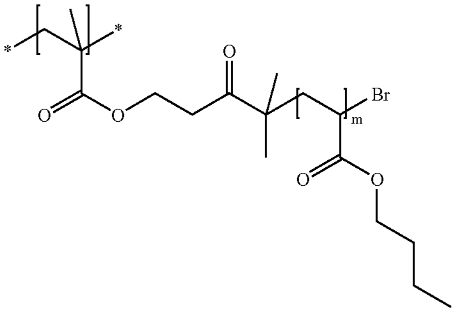

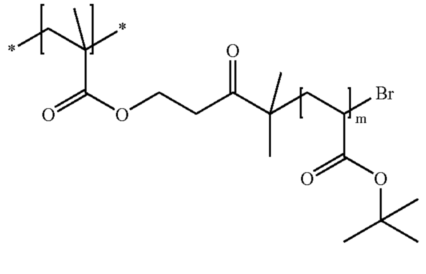

wherein $R^5$ is represented by an alkyl group such as methyl, n-butyl and sec-butyl, and each m by an integer>3.

In a preferred embodiment the DC-graftcopolymer comprises polyethylene oxide or a mixture of polyethylene oxide and polypropylene oxide as hydrophilic polymeric pendant group and polydimethylsiloxane or polymethylphenyl siloxane as hydrophobic polymeric pendant group.

The DC-graftcopolymer can be prepared by several methods. In these methods, several intermediate products are previously prepared:

A=a hydrophilic polymeric group comprising a terminal functional group $G^1$;

B=a hydrophobic polymeric group comprising a terminal functional group $G^2$;

C=a macromonomer formed by a chemical reaction between a monomer having a reactive group $G^3$ and a hydrophilic polymeric group A having a reactive group $G^1$ wherein $G^1$ and $G^3$ form a covalent bound;

D=a macromonomer formed by a chemical reaction between a monomer having a reactive group $G^4$ and a hydrophobic polymeric group B having a reactive group $G^2$ wherein $G^1$ and $G^4$ form a covalent bound.

In a first method a macromonomer C is copolymerised with a monomer having a reactive group $G^5$, and, subsequently, B is further reacted wherein $G^5$ and $G^2$ form a covalent bound.

In a second method a macromonomer D is copolymerised with a monomer having a reactive group $G^6$, and, subsequently, A is further reacted wherein $G^6$ and $G^1$ form a covalent bound.

In a third method a macromonomers C and D are copolymerised. The first and second methods are preferred, the second method is most preferred.

The reactive groups $G^1$ to $G^6$ independently represent a group including an —OH group, an amine group, an anhydride group, an acid group, an acid chloride group or an isocyanate group. The reactive groups are defined in such a way that a chemical reaction is possible. For example, a reaction between an amine group as reactive group and an anhydride group as the other reactive group. Other combination are also possible.

Examples of A are

Jeffamine M-1000, Huntsman Corporation, having the following structure:

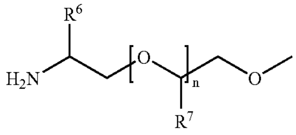

$R^6$=H (86-mol %), —$CH_3$ (14-mol %) and $R^7$=$CH_3$ Other Jeffamines monoamines such as Jeffamine M-600, M-1000 and M-2005 are suitable examples.

Examples of B are:

A polysiloxane B having an —OH group at the end of the chain can be obtained from several suppliers including Shinetsu, Itochu and Chisso.

The polysiloxanes include any compound which contains more than one siloxane group —Si(R',R")—O—, wherein R' and R" are optionally substituted alkyl or aryl groups. Preferred siloxanes are phenylalkylsiloxanes and dialkylsiloxanes, e.g. phenylmethylsiloxanes and dimethylsiloxanes. The number of siloxane groups —Si(R',R")—O— is at least 2, preferably at least 10, more preferably at least 20. It may be less than 100, preferably less than 60.

Examples of C are:

Polydimethylsiloxane having a terminal methacrylate group (PDMS-MA); Chisso $M_w$=1000 g/mol, 94%, Polydimethylsiloxane having a terminal methacrylate group with molecular weights of 5000 g/mol, 8000 g/mol, 10000 g/mol, and 160000 g/mol. Higher molecular weights than 160000 g/mol or lower molecular weights than 1000 g/mol are also suitable examples.

Examples of D are the following:

The polymers D can be synthesized by a reaction of a polysiloxane B having an —OH group at the end of the chain with acryloyl chloride or methacryloyl chloride.

The products of polycondensation may also represent the recurring unit X comprising the polymeric hydrophilic pendant group and recurring unit Y comprising the polymeric hydrophobic pendant group. Polyesters and polyamides are for example obtained by a poycondensation reaction; polyesters can be prepared from diacids and diols, or from hydroxyacids, and polyamides can be prepared from diacids and diamines or from aminoacids.

Surprisingly, it was found that the coating of the heat-sensitive lithographic printing plate of the present invention switches from a hydrophilic state to a hydrophobic state upon exposure to heat and/or to infrared light. The same was observed when exposing the copolymer of the heat-sensitive lithographic printing plate of the present invention to heat. This conversion reaction is illustrated by an increase of the contact angle against water. For measuring the contact angle against water, the coating is applied, for example, onto a glass substrate by spin cast coating. The glass substrate can be covered with more than one polymer monolayer. The contact angle against water changes from values ranging from 20 to 65 before exposure to heat and/or infrared light, to values ranging form 90 to 110 after the exposure.

Typically, by exposure of the coating of the heat-sensitive lithographic printing plate of the present invention comprising a DC-graftcopolymer, with heat and/or infrared light, hydrophobic areas are formed which are ink accepting while the unexposed areas remain hydrophilic and define the non-image areas. Wet processing of the printing plate is not required. Here, wet processing means a developing step wherein a liquid such as an aqueous solution or an aqueous alkaline solution is used.

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is an electrochemically grained and anodized aluminum support. The aluminium is preferably grained by electrochemical graining, and anodized by means of anodizing techniques employing phosphoric acid or a sulphuric acid/phosphoric acid mixture. Methods of both graining and anodization of aluminum are very well known in the art.

By graining (or roughening) the aluminium support, both the adhesion of the printing image and the wetting characteristics of the non-image areas are improved. By varying the type and/or concentration of the electrolyte and the applied voltage in the graining step, different type of grains can be obtained.

By anodising the aluminium support, its abrasion resistance and hydrophilic nature are improved. The microstructure as well as the thickness of the $Al_2O_3$ layer are determined by the anodising step, the anodic weight (g/m $Al_2O_3$ formed on the aluminium surface) varies between 1 and 8 $g/m^2$.

The grained and anodized aluminum support may be post-treated to improve the hydrophilic properties of its surface. For example, the aluminum oxide surface may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with an organic acid and/or salt thereof, e.g. carboxylic acids, hydrocarboxylic acids, sulphonic acids or phosphonic acids, or their salts, e.g. succinates, phosphates, phosphonates, sulphates, and sulphonates. A citric acid or citrate solution is preferred. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB 1084070, DE 4423140, DE 4417907, EP 659909, EP 537633, DE 4001466, EP A 292801, EP A 291760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 μm and is preferably 1 to 10 μm. The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight. The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

According to another embodiment the base layer may also comprise $Al_2O_3$ and an optional binder. Deposition methods for the $Al_2O_3$ onto the flexible support may be (i) physical vapor deposition including reactive sputtering, RF-sputtering, pulsed laser PVD and evaporation of aluminium, (ii) chemical vapor deposition under both vacuum and non-vacuum condition, (iii) chemical solution deposition including spray coating, dipcoating, spincoating, chemical bath deposition, selective ion layer adsorption and reaction, liquid phase deposition and electroless deposition. The $Al_2O_3$ powder can be prepared using different techniques including flame pyrolisis, ball milling, precipitation, hydrothermal synthesis, aerosol synthesis, emulsion synthesis, sol-gel synthesis (solvent based), solution-gel synthesis (water based) and gasphase synthesis. The particle size of the $Al_2O_3$ powders can vary between 2 nm and 30 μm; more preferably between 100 nm and 2 μm.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides.

Particular examples of suitable hydrophilic base layers for use is in accordance with the present invention are disclosed in EP 601240, GB 1419512, FR 2300354, U.S. Pat. No. 3,971,660, and U.S. Pat. No. 4,284,705.

The coating preferably also contains a compound which absorbs infrared light and converts the absorbed energy into heat. The concentration of the IR absorbing compound in the coating is typically between 0.25 and 10.0 wt. %, more preferably between 0.5 and 7.5 wt. %. Preferred IR absorbing compounds are dyes such as cyanine and merocyanine dyes or pigments such as carbon black. Examples of suitable IR absorbers are described in e.g. EP 823327, 978376, 1029667, 1053868, 1093934; WO 97/39894 and 00/29214. A preferred compound is the following cyanine dye:

IR-1

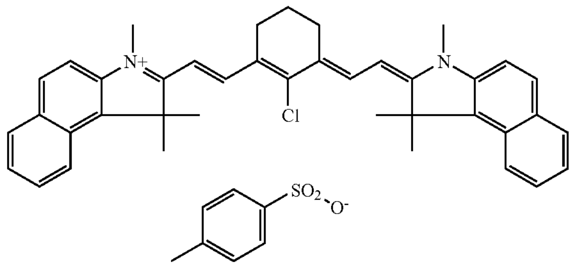

To protect the surface of the coating, in particular from mechanical damage, a protective layer may also optionally be applied. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the protective layer, of organic solvents. The thickness of the protective layer can suitably be any amount, advantageously up to 5.0 μm, preferably from 0.1 to 3.0 μm, particularly preferably from 0.15 to 1.0 μm.

Optionally, the coating may further contain additional ingredients. Preferred ingredients are e.g. additional binders, especially sulfonamide and phthalimide groups containing polymers, to improve the run length and chemical resistance of the plate. Examples of such polymers are those described in EP 933682, EP 894622 and WO 99/63407. Also colorants can be added such as dyes or pigments which provide a visible colour to the coating and which remain in the coating at unexposed areas so that a visible image is produced after exposure and processing. Typical examples of such contrast dyes are the amino-substituted tri- or diarylmethane dyes, e.g. crystal violet, methyl violet, victoria pure blue, flexoblau 630, basonylblau 640, auramine and malachite green. Polymers particles such as matting agents and spacers are also well-known components of lithographic coatings which can be used in the plate precursor of the present invention.

For the preparation of the lithographic plate precursor, any known method can be used. For example, the above ingredients can be dissolved in a solvent mixture which does not react irreversibly with the ingredients and which is preferably tailored to the intended coating method, the layer thickness, the composition of the layer and the drying conditions. Suitable solvents include ketones, such as methyl ethyl ketone (butanone), as well as chlorinated hydrocarbons, such as trichloroethylene or 1,1,1-trichloroethane, alcohols, such as methanol, ethanol or propanol, ethers, such as tetrahydrofuran, glycol-monoalkyl ethers, such as ethylene glycol monoalkyl ether, e.g. 2-methoxy-1-propanol, or propylene glycol monoalkyl ether and esters, such as butyl acetate or propylene glycol monoalkyl ether acetate. It is also possible to use a mixture which, for special purposes, may additionally contain solvents such as acetonitrile, dioxane, dimethylacetamide, dimethylsulfoxide or water.

Any coating method can be used for applying one or more coating solutions to the hydrophilic surface of the support. A multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimised. Drying is typically carried out by blowing hot air onto the coating, typically at a temperature of at least 70° C., suitably 80-150° C. and especially 90-140° C. Also infrared lamps can be used. The drying time may typically be 15-600 seconds.

The printing plate precursor of the present invention can be image-wise exposed directly with heat, e.g. by means of a thermal head, or indirectly by infrared light, preferably near infrared light. The infrared light is preferably converted into heat by an IR light absorbing compound as discussed above. The heat-sensitive lithographic printing plate precursor of the present invention is preferably not sensitive to visible light. Most preferably, the coating is not sensitive to ambient daylight, i.e. visible (400-750 nm) and near UV light (300-400 nm) at an intensity and exposure time corresponding to normal working conditions so that the material can be handled without the need for a safe light environment.

The printing plate precursor of the present invention can be exposed to infrared light by means of e.g. LEDs or a laser. Most preferably, the light used for the exposure is a laser emitting near infrared light having a wavelength in the range from about 750 to about 1500 nm, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e.

the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T (trademark of Agfa Gevaert N.V.) is a typical example of a plate-setter using the ITD-technology. XTD plate-setters for thermal plates having a typical laser power from about 20 mW to about 500 mW operate at a lower scan speed, e.g. from 0.1 to 20 m/sec. The Creo Trendsetter plate-setter family (trademark of Creo) and the Agfa Excalibur plate-setter family (trademark of Agfa Gevaert N.V.) both make use of the XTD-technology.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

The plate precursor according to the invention can, if required, then be post-treated with a suitable correcting agent or preservative as known in the art. To increase the resistance of the finished printing plate and hence to extend the print run, the layer can be briefly heated to elevated temperatures ("baking"). As a result, the resistance of the printing plate to washout agents, correction agents and UW-curable printing inks also increases. Such a thermal post-treatment is described, inter alia, in DE-A 14 47 963 and GB-A 1 154 749.

The printing plate thus obtained can be used for conventional, so-called wet offset printing, in which ink and an aqueous dampening liquid is supplied to the plate. Another suitable printing method uses so-called single-fluid ink without a dampening liquid. Single-fluid inks which are suitable for use in the method of the present invention have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

1. Materials 1.1. Polydimethylsiloxane having a terminal methacrylate group (PDMS-MA); Chisso $M_w$=1000 g/mol, 94%.

PDMS-MA is purified by the following method:

The PDMS-MA is purified by filtration over a two-layer comlumn of silica gel (20 cm) and aluminum oxide (Al2O3) using absolute chloroform as the mobile phase.

1.2. Maleic anhydride (MSA), Merck, 98%

Purified by Sublimation under vacuum at 80° C.

1.3. Jeffamine M-1000, Huntsman Corporation.

Jeffamine M-1000 is purified as followed:

In a 250 ml round bottom flask six gram of Jeffamine monoamine M-1000 was dissolved in 40 ml ethanol, than n-heptane was added slowly until the mixture became turbid. The two phases were separated by means of a separation funnel. The heavy phase (mixture of ethanol/amine) was recovered and re-precipitated in n-heptane. Then the excess of ethanol was evaporated and the residue was dried under vacuum overnight at room temperature. The purity of the end product was verified by Size Exclusion Chromatography.

2. Synthesis of the Double Comb Polymers.

2.1. Step 1: copolymerization of PDMS-MA and MSA to yield poly[PDMS-MA-co-MSA].

A 250 ml two necked round bottomed flask was charged with 2-mol % of dimethyl-2,2'-azobis(2-methylpropionate) (V-6), followed by the monomers PDMS-MA and MSA at the desired ratios (see Table 1). Then absolute benzene was added. The content of the flask was degassed 3 times to remove the air. The reaction was carried out under argon atmosphere at 600° C. for 6-hours. The polymer was recovered by precipitation in a mixture of methanol:diethyl ether (1:1), this procedure was repeated until the remaining PDMS-MA was removed. The end product (CMSA 34, 35, 36 and 38) was dried under vacuum at room temperature overnight.

TABLE 1

Concentration of the reagentia.

| Poly [PDMS-MA-co-MSA] | PDMS-MA g | MSA G | V-6 mg | $V_{benzene}$ ml |
|---|---|---|---|---|
| CMSA34 | 6 | 0.183 | 72.0 | 12 |
| CMSA35 | 6 | 0.571 | 105 | 12 |
| CMSA36 | 6 | 2.350 | 234 | 12 |
| CMSA38 | 9 | 0.360 | 140 | 24 |

2.2. Step 2: synthesis of poly[PDMS-MA-co-(MSA-graft-Jeffamine)]:

The grafting reaction of Jeffamine M-1000 on poly [PDMS-MA-co-MSA] is a two step process, involving (i) the nucleophilic addition of the amine group to a carbonyl unit of the MSA rings to form an amic acid intermediate, and (ii) the formation of an cyclic imide with water expellation. Since both the steps require different reaction conditions the amic acid can be isolated and investigated. It turned out that the amic acid form was not stable against crosslinking in bulk and at ambient conditions, hence it had to be converted to the imide form (FIG. 1 gives a schematically representation of the reaction).

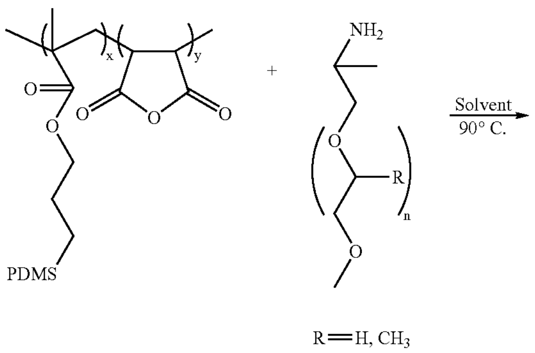

-continued

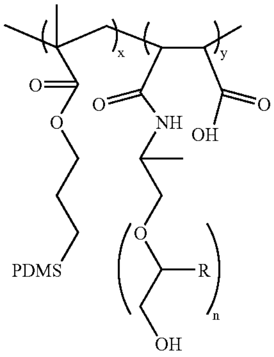

Figure 1, step 1

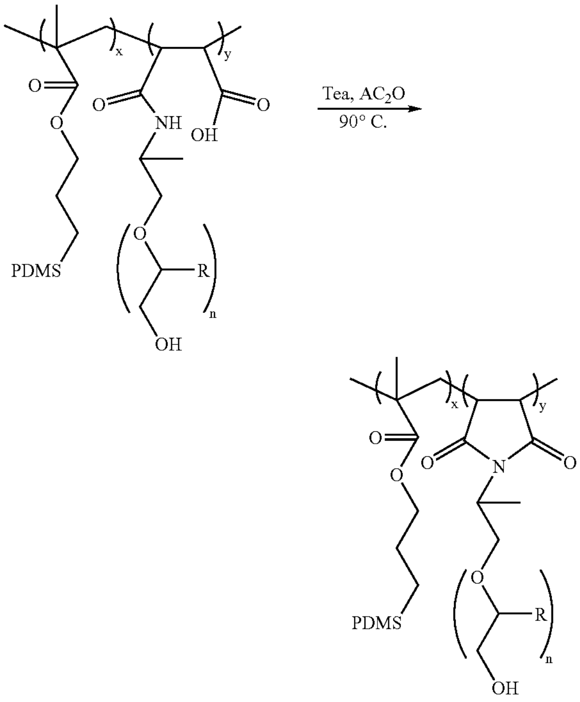

Figure 1, step 2 wherein x, y and n are integers>1 and wherein R is H or methyl or a mixture of H and methyl.

A 100 ml three-necked round bottle equipped with a stirring bar, reflux condenser, inert-line and septum to add the monomer was used. The concentration of the reagentia used in the synthesis, are given in Table 2.

The following procedure was used:

Poly[PDMS-MA-co-MSA] copolymer and Jeffamine M-1000 were added and dissolved in 9 ml of xylene/DMF (2:3) and heated at 90° C. for 24 hours. Subsequently, triethylamine (=TEA) and acetic anhydride (=$AC_2O$) were added to the mixture and heated for 24 hours at 90° C. After this time the reaction was ended and the solvent was removed by evaporation. The polymer was re-dissolved in 15 ml of toluene and transferred in a separation funnel. 20 ml of distilled water was added and, after shaking, the light phase was separated. The organic layer was washed twice with 20 ml of distilled water. The solvent was removed on a rotary evaporator and the graft polymer was dried under vacuum at room temperature for 24 hours. The polymer was isolated as a waxy-brown material. The graft copolymers were analysed by Size Exclusion Chromatography to confirm that the non-reacted Jeffamine was removed.

TABLE 2

Concentration of the reagentia.

| Double comb graft-copolymers | [PDMS-MA-co-MSA] | Jeffamine M-1000 mg | trietyl amine mg | Acetic anhydride mg | $V_{xylene/DMF}$ ml |
|---|---|---|---|---|---|
| DC18 | CMSA34 1 g | 0.54 | 0.10 | 0.10 | 9 |
| DC20 | CMSA35 1 g | 1.14 | 0.15 | 0.18 | 9 |
| DC21 | CMSA36 1 g | 18.20 | 1.83 | 2.47 | 9 |
| DC23 | CMSA38 9 g | 2300 | 3600 | 6300 | 84 |

3. Contact Angle Measurements Against Water.

Thin films from double comb polymers DC 18, DC 20, DC 21 and 10 DC 23 were prepared according to the following procedure: 0.2 ml of a 1 wt % polymer solution in toluene was spin casted on a glass substrate at 2000 rpm for 1 minute. The contact angle 0 against water of the spin cast copolymer films on the glass substrate, were determined by means of sessile drop and annealing for 2 minutes at 150° C. The results are summarized in Table 3.

TABLE 3

Contact angle θ against water

| Double comb graftcopolymer | θ [°] at room temperature | θ [°] annealed at 150° |
|---|---|---|
| DC18 | 20 | 100 |
| DC20 | 41 | 98 |
| DC21 | 62 | 101 |
| DC23 | 40 | 98 |

Table 3 clearly shows an increase in contact angle against water after annealing the substrate indicating a hydrophilic/hydrophobic conversion.

4. Preparation of Thermal Printing Plates.

Solution A containing double comb polymer DC 23 was combined with solution B containing 0.54% IR absorber (mixture of 0.27% PRO-JET 900NP+0.27% PRO-JET 830NP, trademarks of Avecia). This coating solution was coated on a grained and anodized aluminum substrate heated at 40° C. and subsequently dried using a hair dryer. The compositions of the coatings are shown in Table 4.

TABLE 4

Coating compositions.

| Example Nr. | Solution A: DC23 | Solution B: 0.54% wt I.R. absorber* in toluene | Coating µm wet thickness | Coating after drying $g/m^2$ |
|---|---|---|---|---|
| 1 | 6 ml of a 2% DC23 in toluene | 1 ml | 20 | 0.34 DC23 0.016 I.R. |
| 2 | 2 ml of a 2% DC23 in toluene | 2 ml | 20 | 0.4 DC23 0.054 I.R. |

TABLE 4-continued

| Coating compositions. | | | | |
|---|---|---|---|---|
| Example Nr. | Solution A: DC23 | Solution B: 0.54% wt I.R. absorber* in toluene | Coating µm wet thickness | Coating after drying g/m$^2$ |
| 3 | 1 ml of a 2% DC23 in toluene | 3 ml | 20 | 0.4 DC23 0.081 I.R. |

*mixture of 0.27% PRO-JET 900NP + 0.27% PRO-JET 830NP

5. Print Results.

The coatings were exposed using an 830 nm IR laser (1000 mJ/cm$^2$ and at 4 m/s) and prints were obtained by using an off-set printer GTO 52 (available from Heidelberger Druckmaschinen AG). The printing results are shown in Table 5. The ink density is the optical density, measured by using a GretagMacbeth densitometer Type D19C. The values were corrected for the paper density.

The results shows that low optical density values are obtained in the non-image areas and high optical densities in the imaged areas.

TABLE 5

| Printing results. | | |
|---|---|---|
| Example Nr. | Optical density of the imaged areas after 100 prints | Optical density of the non-image areas |
| 1 | 1.27 | 0.013 |
| 2 | 1.37 | 0.024 |
| 3 | 1.17 | 0.020 |

The invention claimed is:

1. A heat-sensitive lithographic printing plate precursor comprising on a support having a hydrophilic surface or which is provided with a hydrophilic layer, a coating comprising an infrared absorbing agent and a copolymer comprising a plurality of recurring units X and a plurality of recurring units Y, wherein the recurring unit X is represented by the following formula:

X

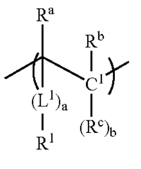

and the recurring unit Y is represented by the following formula:

Y

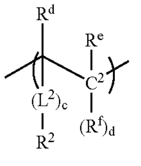

wherein a and c are 0 or 1, wherein $L^1$ and $L^2$ independently represent a linking group, wherein $R^a$, $R^b$, $R^c$, $R^d$, $R^e$ and $R^f$ independently represent hydrogen, an alkyl, cycloalkyl, aryl, heteroaryl group, a carboxylic acid, an ester of a carboxylic acid, an amide of a carboxylic acid, or an akyl or aryl group which is substituted with a carboxylic acid, with an ester of a carboxylic acid or with an amide of a carboxylic acid, wherein b is 0 or 1 and when b=0, a=1 and $L^1$ is further bound to $C^1$ to form a cyclic structure, wherein d is 0 or 1 and when d=0, c=1 and $L^2$ is further bound to $C^2$ to form a cyclic structure, and wherein $R^1$ and $R^2$ represent respectively a hydrophilic polymeric pendant group and a hydrophobic polymeric pendant group.

2. The heat-sensitive lithographic printing plate precursor according to claim 1 wherein the linking groups $L^1$ and $L^2$ which form a cyclic structure are linking groups including a nitrogen atom.

3. The heat-sensitive lithographic printing plate precursor according to claim 2 wherein the hydrophilic polymeric pendant group comprises hydrophilic monomeric units selected from monomers comprising an anionic, a cationic or a non-ionic group.

4. The heat-sensitive lithographic printing plate precursor according to claim 2 wherein the hydrophobic polymeric pendant group comprises hydrophobic monomeric units comprising siloxanes, perfluoroalkylethylene, alkylacrylates, fluorinated alkylacrylates, chlorinated or brominated monomers, vinyl esters, vinyl ethers, ethylene, isoprene, butadiene, styrene, styrene derivatives, alkylmethacrylates, allyl methacrylates, fluorinated alkylmethacrylates, acrylonitrile methacrylonitrile, N-alkylacrylamides or N-alkylmethacrylamides.

5. The heat-sensitive lithographic printing plate precursor according to claim 1 wherein the recurring unit X is represented by the following formula:

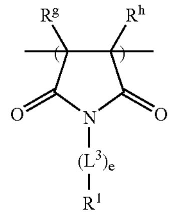

wherein e is 0 or 1, wherein $L^3$ represents a linking group, and wherein $R^g$ and $R^h$ independently represent hydrogen, an alkyl, cycloalkyl, aryl, or heteroaryl group.

6. The heat-sensitive lithographic printing plate precursor according to claim 5 wherein the hydrophilic polymeric pendant group comprises hydrophilic monomeric units selected from monomers comprising an anionic, a cationic or a non-ionic group.

7. The heat sensitive lithographic printing plate precursor according to claim 5 wherein the coating is capable of switching from a hydrophilic state into a hydrophobic state or from a hydrophobic state into a hydrophilic state upon exposure to heat and/or infrared light.

8. A method for preparing a heat-sensitive lithographic printing plate without wet processing comprising the steps of:

(i) providing a lithographic printing plate precursor according to claim 5; and
(ii) image-wise exposing the coating to heat and/or infrared light.

9. A method for increasing the contact angle, measured against water, of a coating comprising the steps of:
(i) providing a lithographic printing plate precursor according to claim 5; and
(ii) image-wise heating said coating by means of infrared light and/or heat.

10. A heat-sensitive lithographic printing plate precursor according to claim 5 wherein the recurring unit Y is represented by the following formula:

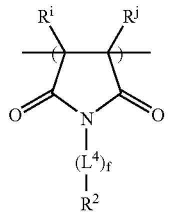

wherein f is 0 or 1,
wherein $L^4$ represent a linking group,
and wherein $R^i$ and $R^j$ independently represent hydrogen, an alkyl, cycloalkyl, aryl, or heteroaryl group.

11. A process of changing the surface of a lithographic printing plate from a hydrophilic state into a hydrophobic state by an image-wise exposure to heat or infrared light of a heat-sensitive lithographic printing plate precursor according to claim 10.

12. The heat-sensitive lithographic printing plate precursor according to claim 1 wherein the recurring unit Y is represented by the following formula:

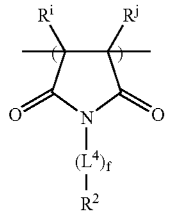

wherein f is 0 or 1,
wherein $L^4$ represents a linking group,
and wherein $R^i$ and $R^j$ independently represent hydrogen, an alkyl, cycloalkyl, aryl, or heteroaryl group.

13. The heat-sensitive lithographic printing plate precursor according to claim 12 wherein the hydrophobic polymeric pendant group comprises hydrophobic monomeric units comprising siloxanes, perfluoroalkylethylene, alkylacrylates, fluorinated alkylacrylates, chlorinated or brominated monomers, vinyl esters, vinyl ethers, ethylene, isoprene, butadiene, styrene, styrene derivatives, alkylmethacrylates, allyl methacrylates, fluorinated alkylmethacrylates, acrylonitrile methacrylonitrile, N-alkylacrylamides or N-alkylmethacrylamides.

14. The heat sensitive lithographic printing plate precursor according to claim 12 wherein the coating is capable of switching from a hydrophilic state into a hydrophobic state or from a hydrophobic state into a hydrophilic state upon exposure to heat and/or infrared light.

15. A method for preparing a heat-sensitive lithographic printing plate without wet processing comprising the steps of:
(i) providing a lithographic printing plate precursor according to claim 12; and
(ii) image-wise exposing the coating to heat and/or infrared light.

16. A method for increasing the contact angle, measured against water, of a coating comprising the steps of:
(i) providing a lithographic printing plate precursor according to claim 12; and
(ii) image-wise heating said coating by means of infrared light and/or heat.

17. A method for preparing a heat-sensitive lithographic printing plate without wet processing comprising the steps of:
(i) providing a lithographic printing plate precursor according to claim 1; and
(ii) image-wise exposing the coating to heat and/or infrared light.

18. A method for increasing the contact angle, measured against water, of a coating comprising the steps of:
(i) providing a lithographic printing plate precursor according to claim 1; and
(ii) image-wise heating said coating by means of infrared light and/or heat.

19. A process of changing the surface of a lithographic printing plate from a hydrophilic state into a hydrophobic state by an image-wise exposure to beat or infrared light of a heat-sensitive lithographic printing plate precursor according to claim 1.

20. The heat-sensitive lithographic printing plate precursor according to claim 1 wherein the hydrophilic polymeric pendant group comprises hydrophilic monomeric units selected from monomers comprising an anionic, a cationic or a non-ionic group.

21. The heat-sensitive lithographic printing plate precursor according to claim 1 wherein the hydrophobic polymeric pendant group comprises hydrophobic monomeric units comprising siloxanes, perfluoroalkylethylene, alkylacrylates, fluorinated alkylacrylates, chlorinated or brominated monomers, vinyl esters, vinyl ethers, ethylene, isoprene, butadiene, styrene, styrene derivatives, alkylmethacrylates, allyl methacrylates, fluorinated alkylmethacrylates, acrylonitrile methacrylonitrile, N-alkylacrylamides or N-alkylmethacrylamides.

22. The heat-sensitive lithographic, printing plate precursor according to claim 21 wherein the hydrophilic polymeric pendant group comprises hydrophilic monomeric units selected from monomers comprising an anionic, a cationic or a non-ionic group.

23. The heat-sensitive lithographic printing plate precursor according to claim 22 wherein the hydrophilic monomer comprises alkylene oxides, vinyl alcohol, acrylic acid, methacrylic acid, maleic acid, itaconic acid, crotonic acid, fumaric acid, hydroxyalkyl methacrylate, hydroxyalkyl acrylate, vinylpyrrolidone, acrylamides, methacrylamides, vinylphosphonic acid, styrene sulfonic acid, vinyl methyl ether, vinyl sulfonate, sulphoethyl methacrylate, 2-acrylamido-2-methyl-1-propanesulfonic acid, or protonated or alkylated derivates of vinylpyridine, vinylimidazole or N-vinyl diethylamine.

24. The heat sensitive lithographic printing plate precursor according to claim 23 wherein the coating is capable of switching from a hydrophilic state into a hydrophobic state or from a hydrophobic state into a hydrophilic state upon exposure to heat and/or infrared light.

25. The heat-sensitive lithographic printing plate precursor according to claim 23 wherein the hydrophilic monomeric units are ethylene oxide or a mixture of ethylene oxide and propylene oxide.

26. The heat-sensitive lithographic printing plate precursor according to claim, 25 wherein the hydrophobic monomeric units are dimethyl siloxane or methylphenyl siloxane.

27. The heat-sensitive lithographic printing plate precursor according to claim 21 wherein the hydrophobic polymeric pendant group comprises hydrophobic monomeric units comprising dimethyl siloxane or methylphenyl siloxane.

* * * * *